(12) United States Patent
Raghunathan et al.

(10) Patent No.: US 10,872,854 B2
(45) Date of Patent: Dec. 22, 2020

(54) ELECTRO-OPTICAL PACKAGE AND METHOD OF FABRICATION

(71) Applicant: ROCKLEY PHOTONICS LIMITED, London (GB)

(72) Inventors: Vivek Raghunathan, Mountain View, CA (US); Vivek Raghuraman, Santa Clara, CA (US); Karlheinz Muth, Richardson, TX (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/393,763

(22) Filed: Apr. 24, 2019

(65) Prior Publication Data

US 2019/0333905 A1   Oct. 31, 2019

Related U.S. Application Data

(60) Provisional application No. 62/662,619, filed on Apr. 25, 2018.

(51) Int. Cl.
| | |
|---|---|
| *H01L 23/498* | (2006.01) |
| *H01L 31/02* | (2006.01) |
| *G02B 6/42* | (2006.01) |
| *H01L 23/00* | (2006.01) |
| *H01L 25/18* | (2006.01) |
| *H01L 25/00* | (2006.01) |

(52) U.S. Cl.
CPC ...... *H01L 23/49838* (2013.01); *G02B 6/4274* (2013.01); *H01L 24/09* (2013.01); *H01L 31/02005* (2013.01); *H01L 23/49827* (2013.01); *H01L 25/18* (2013.01); *H01L 25/50* (2013.01); *H01L 2224/023* (2013.01); *H01L 2924/1433* (2013.01)

(58) Field of Classification Search
None
See application file for complete search history.

(56) References Cited

U.S. PATENT DOCUMENTS

| | | |
|---|---|---|
| 8,781,267 B2 | 7/2014 | Julien et al. |
| 9,082,745 B2 | 7/2015 | Morris |

(Continued)

FOREIGN PATENT DOCUMENTS

| | | |
|---|---|---|
| KR | 10-20170073706 A | 6/2017 |
| WO | WO 2013/165344 A1 | 11/2013 |

(Continued)

OTHER PUBLICATIONS

U.S. Appl. No. 16/382,076, filed Apr. 11, 2019.

(Continued)

*Primary Examiner* — Jerry Rahll
(74) *Attorney, Agent, or Firm* — Lewis Roca Rothgerber Christie LLP

(57) ABSTRACT

An electro-optical package. In some embodiments, the package includes an electronic integrated circuit module, a first electro-optical component, and a photonic integrated circuit. The first electro-optical component may be in a top surface of the photonic integrated circuit. The electronic integrated circuit module may have a top surface facing toward and overlapping both a portion of the first electro-optical component, and a portion of the photonic integrated circuit.

25 Claims, 9 Drawing Sheets

(56) References Cited

U.S. PATENT DOCUMENTS

| | | | |
|---|---|---|---|
| 9,391,708 | B2 | 7/2016 | Fincato et al. |
| 9,490,240 | B2 | 11/2016 | Lucero et al. |
| 9,496,248 | B2 | 11/2016 | Lee et al. |
| 9,515,746 | B2 | 12/2016 | Flens et al. |
| 9,557,478 | B2 | 1/2017 | Doerr et al. |
| 9,575,267 | B1 | 2/2017 | Shastri et al. |
| 9,935,088 | B2 | 4/2018 | Budd et al. |
| 2012/0014639 | A1 | 1/2012 | Doany et al. |
| 2013/0308898 | A1* | 11/2013 | Doerr .................... G02B 6/428 385/14 |
| 2014/0064659 | A1 | 3/2014 | Doerr et al. |
| 2014/0203175 | A1 | 7/2014 | Kobrinsky et al. |
| 2016/0013866 | A1 | 1/2016 | Doerr |
| 2016/0124164 | A1 | 5/2016 | Doerr |
| 2019/0243066 | A1 | 8/2019 | Mahgerefteh et al. |

FOREIGN PATENT DOCUMENTS

| | | |
|---|---|---|
| WO | WO 2014/014846 A2 | 1/2014 |
| WO | WO 2016/077500 A8 | 5/2016 |

OTHER PUBLICATIONS

U.S. Appl. No. 16/383,309, filed Apr. 12, 2019.
Website: "Silicon Wafer Integrated Fan-out Technology (SWIFT™) Packaging for Highly Integrated Products", Amkor, https://c44f5d406df450f4a66b-1b94a87d576253d9446df0a9ca62e142.ssl.cf2.rackcdn.com/2017/12/SWIFT_Packaging_for_Highly_Integrated_Products_WhitePaper_0617.pdf, printed on Apr. 8, 2018, 4 pages.
International Search Report and Written Opinion of the International Searching Authority, dated Sep. 23, 2019, Corresponding to PCT/IB2019/000382, 13 pages.
International Search Report and Written Opinion of the International Searching Authority, dated Sep. 30, 2019, Corresponding to PCT/IB2019/000383, 13 pages.
International Search Report and Written Opinion of the International Searching Authority, dated Oct. 9, 2019, Corresponding to PCT/IB2019/000607, 13 pages.
U.S. Appl. No. 16/824,609, filed Mar. 19, 2020.
U.S. Appl. No. 16/836,815, filed Mar. 31, 2020.

* cited by examiner

ELECTRO-OPTICAL PACKAGE AND METHOD OF FABRICATION

CROSS-REFERENCE TO RELATED APPLICATION(S)

The present application claims priority to and the benefit of U.S. Provisional Application No. 62/662,619, filed Apr. 25, 2018, entitled "PACKAGING OF OPTICAL AND ELECTRONIC COMPONENTS", the entire content of which is incorporated herein by reference.

FIELD

One or more aspects of embodiments according to the present disclosure relate to electro-optical systems, and more particularly to a package including both electronic elements and electro-optical elements.

BACKGROUND

In electro-optical systems used for high speed digital communications, maintaining short, impedance-matched connections between electro-optical elements and electronic integrated circuits may be advantageous. Some types of electrical connections, e.g., connections using printed circuit board traces, or using wire bonds, may have disadvantages in terms of length and impedance mismatch.

Thus, there is a need for an improved package for electro-optical elements and electronic integrated circuits.

SUMMARY

According to an embodiment of the present invention, there is provided a package, including: an electronic integrated circuit module; a first electro-optical component; and a photonic integrated circuit, the first electro-optical component being in a top surface of the photonic integrated circuit, the electronic integrated circuit module having a top surface facing toward and overlapping: a portion of the first electro-optical component, and a portion of the photonic integrated circuit.

In some embodiments, the electronic integrated circuit module includes: an electronic integrated circuit chip having a top surface; and a plurality of conductors protruding from the top surface of the electronic integrated circuit chip, wherein the top surface of the electronic integrated circuit chip faces toward and overlaps: a portion of the first electro-optical component, and a portion of the photonic integrated circuit; and wherein a conductive path from the electronic integrated circuit chip to the first electro-optical component extends through a conductor of the plurality of conductors.

In some embodiments, the electronic integrated circuit module includes: an electronic integrated circuit chip having a top surface; a redistribution layer on the top surface of the electronic integrated circuit chip; and a plurality of conductors protruding from the top surface of the redistribution layer, wherein the top surface of the redistribution layer faces toward and overlaps: a portion of the first electro-optical component, and a portion of the photonic integrated circuit; and wherein a conductive path from the electronic integrated circuit chip to the first electro-optical component extends through a conductor of the plurality of conductors.

In some embodiments, the package further includes an underfill surrounding each of the plurality of conductors.

In some embodiments, the electronic integrated circuit module includes a physical medium dependent circuit, configured to interface with the first electro-optical component.

In some embodiments, the physical medium dependent circuit is in the electronic integrated circuit chip.

In some embodiments, the physical medium dependent circuit is in a chip, separate from the electronic integrated circuit chip, on the bottom surface of, and connected to, the redistribution layer.

In some embodiments, the first electro-optical component is a chip embedded in a cavity in the top surface of the photonic integrated circuit.

In some embodiments, the package further includes a eutectic bond between the first electro-optical component and a conductive trace on the top surface of the photonic integrated circuit.

In some embodiments, the first electro-optical component is integral with the photonic integrated circuit.

In some embodiments, the package further includes a second electro-optical component, wherein: the first electro-optical component includes a photodiode chip, and the second electro-optical component includes a modulator chip.

In some embodiments, the package further includes a via interposer having: a first surface facing the electronic integrated circuit module; a second surface opposite the first surface; and a plurality of conductive vias extending from the first surface to the second surface, the via interposer abutting against the top surface of the electronic integrated circuit module, and the conductive vias being respectively electrically connected to a plurality of conductors on the top surface of the electronic integrated circuit module.

In some embodiments, the package further includes a redistribution layer having a top surface and a bottom surface, the bottom surface abutting against: the bottom surface of the photonic integrated circuit; and the second surface of the via interposer.

In some embodiments, the package further includes a plurality of conductors protruding from the top surface of the redistribution layer.

In some embodiments, the via interposer is integral with the photonic integrated circuit.

In some embodiments, the via interposer is a separate element from the photonic integrated circuit.

In some embodiments, the photonic integrated circuit has a cutout to accommodate the via interposer, and the photonic integrated circuit wraps around at least two sides of the via interposer.

In some embodiments: the via interposer is rectangular, the cutout is a hole, and the photonic integrated circuit wraps around all four sides of the via interposer.

According to an embodiment of the present invention, there is provided a method for fabricating a package, the method including forming a first intermediate product on a first temporary carrier, the forming of the first intermediate product including: forming a redistribution layer on the first temporary carrier; bonding a via interposer to the redistribution layer; bonding a photonic integrated circuit to the redistribution layer; and attaching an electronic integrated circuit module to the via interposer and to the photonic integrated circuit.

In some embodiments, the method further includes: debonding the first intermediate product from the first temporary carrier; flipping the first intermediate product; attaching the flipped first intermediate product to a second temporary carrier; and forming a ball grid array on the redistribution layer.

According to an embodiment of the present invention, there is provided a hybrid interposer, including: an electro-optical component; a photonic integrated circuit; and a via interposer, the electro-optical component being in a top surface of the photonic integrated circuit, the via interposer begin adjacent to an edge of the photonic integrated circuit and having: a first surface substantially level with a top surface of the photonic integrated circuit; a second surface opposite the first surface; and a plurality of conductive vias extending from the first surface to the second surface.

In some embodiments, the hybrid interposer further includes a redistribution layer, the photonic integrated circuit being on a bottom surface of the redistribution layer; and the via interposer being on the bottom surface of the redistribution layer, a via of the via interposer being connected to a conductor in the redistribution layer.

In some embodiments, the top surface of the photonic integrated circuit has: a waveguide mode converter, and a V-groove, the V-groove being configured to align an optical fiber to the waveguide mode converter, the waveguide mode converter being configured to couple light between the optical fiber and the electro-optical component.

In some embodiments, the hybrid interposer further includes a plurality of conductors protruding from a top surface of the redistribution layer.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an electro-optical package provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
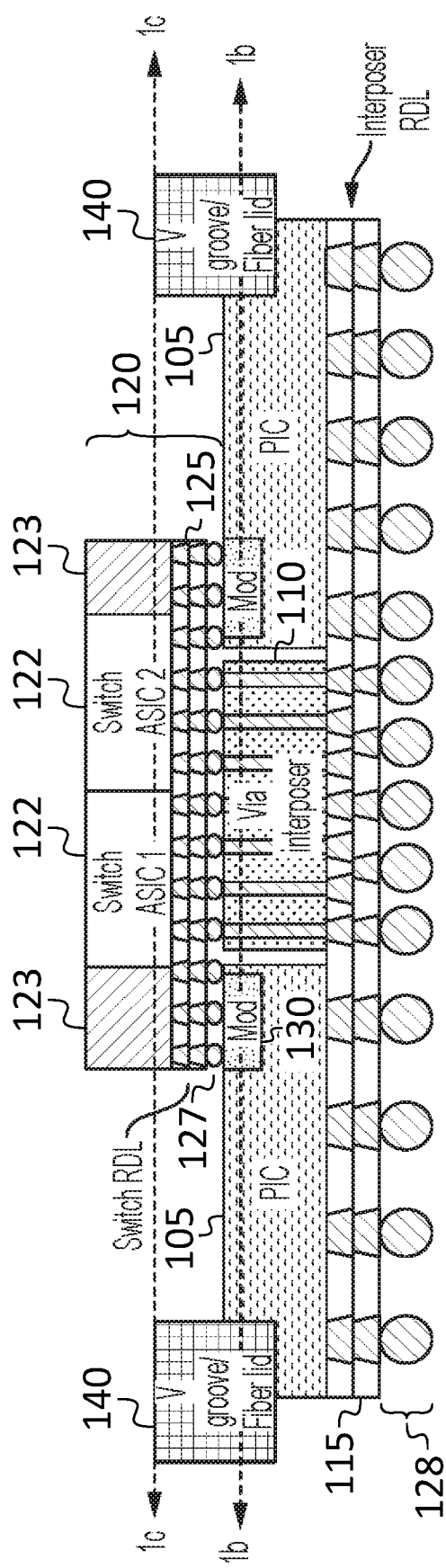
FIG. 1a is a side cross-sectional view of an electro-optical package, according to an embodiment of the present disclosure.

FIG. 1a shows a side cross-sectional view of an electro-optical package in one embodiment. The electro-optical package has four (or more) photonic integrated circuits (PICs) 105 (of which two are visible in FIG. 1a) surrounding a central via core or "via interposer" 110 (made of silicon, glass, organic material, or the like) that is bonded to a fan-out redistribution layer (RDL) structure, which may be referred to herein as the "interposer RDL" 115. A first array of protruding conductors 128 (e.g., a ball-grid array, which may be referred to as the "interposer BGA") may be formed on (and protrude from) a surface (referred to as the "top surface", as discussed below) of the interposer RDL 115.

The electro-optical package may further include one or more electronic integrated circuit modules or "switch ASIC modules" 120. Each such switch ASIC module 120 may include one or more switch integrated circuits 122 (each of which may be, for example, a switch application-specific integrated circuit (a "switch ASIC"), or, in some embodiments, a NIC (network integrated circuit), or an FPGAs (field programmable gate array)). Each of the switch integrated circuits 122 may be a single semiconductor chip, or "die". The switch ASIC module 120 may further include an RDL referred to as the "Switch RDL" or "ASIC RDL" 125, and a second array of protruding conductors 127 (e.g., copper pillars or solder balls), which may be referred to as the "pins" of the switch ASIC module 120, and which may be attached to (and protrude from) the "top surface" of the switch RDL 125 (which is the lower surface in the orientation of FIG. 1a), for forming connections to other elements (as discussed in further detail below). In some embodiments, the switch RDL 125 may be absent (and, for example, the switch ASIC module 120 may consist only of a switch integrated circuit chip and an array of protruding conductors (e.g., copper pillars) on the top surface of the switch integrated circuit chip). In some embodiments, the switch ASIC module 120 may include additional elements, such as an overmold 123 encapsulating (or, as shown in FIG. 1a, surrounding) the one or more switch integrated circuits 122. As used herein, an "electronic integrated circuit module" (such as the switch ASIC module 120) is an element including one or more electronic integrated circuits, and having an array of conductors on a top surface for forming connections to the one or more electronic integrated circuits.

As used herein the "top surface" of an (electronic or photonic) integrated circuit is the surface on which fine features (e.g., transistors or waveguides) are formed (e.g., by photolithography). The "top surface" of an RDL is the surface used for forming an external connection (and which may have a of an array of protruding conductors for this purpose). In the orientation in which the an electro-optical package is shown in FIG. 1a, the top surface of each of the RDLs (the switch RDL 125 and the interposer RDL 115) is the lower surface, the top surface of each of the switch integrated circuits 122 is the lower surface, and the top surface of the photonic integrated circuit 105 is the upper surface. As may be seen in FIG. 1a, in some embodiments, the top surface of the switch ASIC module 120 faces toward the PIC 105 and the electro-optical chips 130, 135, and the top surfaces of the PIC 105 and the electro-optical chips 130, 135 face toward the switch ASIC module 120.

Each RDL may consist of a layer of polyimide with conductive traces and conductive vias; each RDL may in turn include a plurality of layers, i.e., it may include one or more RDLs. Each of the interposer RDL 115 and the switch RDL 125 may be a composite RDL including up to four single-layer RDLs (a single layer RDL having one insulating layer, and possibly having (i) conductive traces on one or both of its surfaces and (ii) conductive vias through the insulating layer).

Figure 1B:
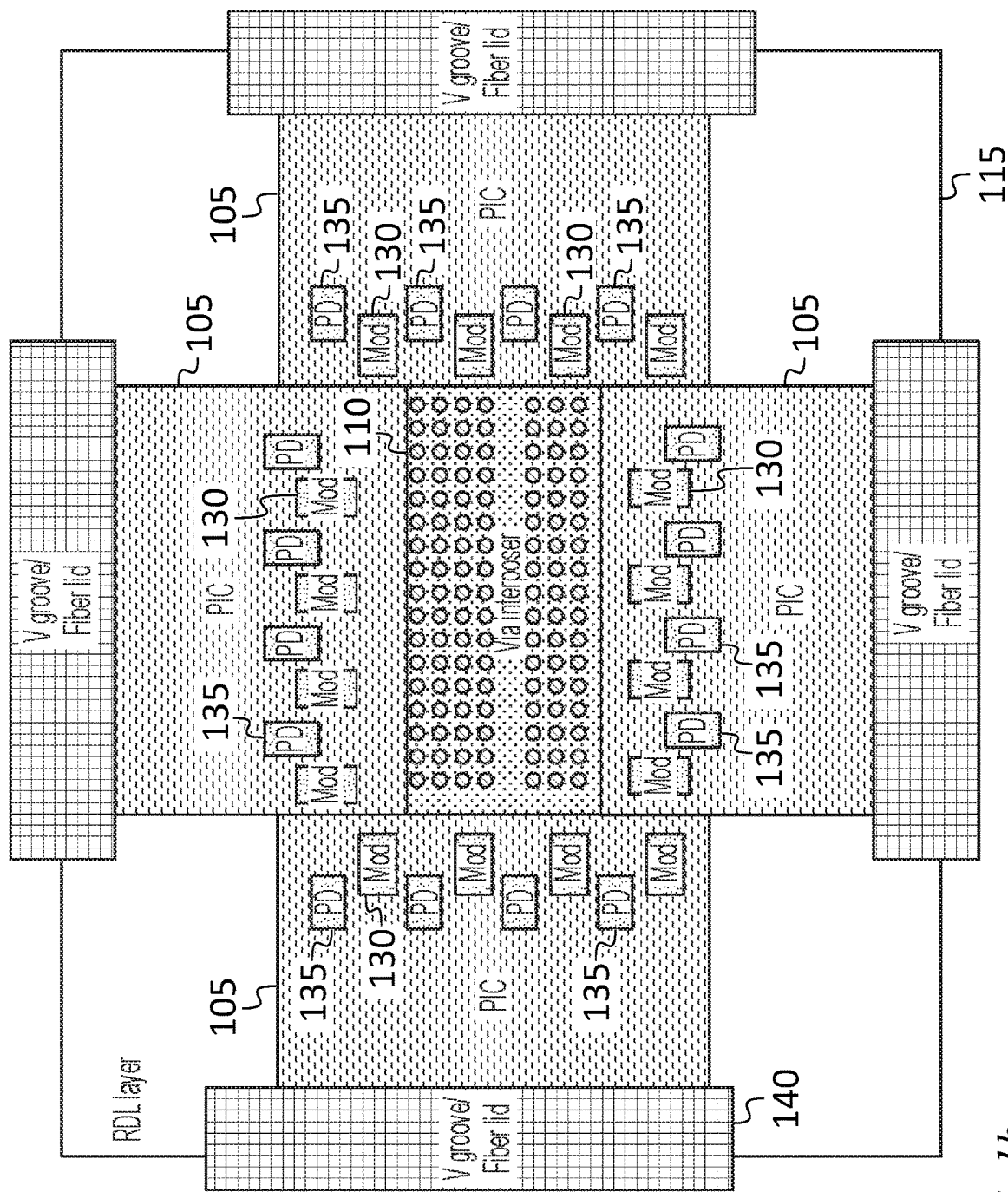
FIG. 1b is an approximate top cross-sectional view along section line 1b-1b of FIG. 1a, according to an embodiment of the present disclosure.

FIG. 1b is an approximate top cross-sectional view of the embodiment of FIG. 1a along section line 1b-1b of FIG. 1a. A plurality of modulator chips 130 ("Mod") and photodetector chips (e.g., photodiode chips 135 ("PD")) (collectively referred to as "electro-optical chips" 130, 135) are arranged on each PIC 105. Each switch ASIC module 120 overlaps the PICs 105 to which it is connected, and is bonded directly to the PICs 105 (or to the electro-optical chips 130, 135) in the area of overlap. Each electro-optical chip 130, 135 is under, or extends under, an switch ASIC module 120, i.e., at least a portion of each of the electro-optical chips is in an area of overlap. The switch ASIC module 120 may have high speed signal pins (connected to the PICs 105 or the electro-optical chips 130, 135) on the periphery and low speed DC, power, ground, and I/O pins (connected to the via interposer 110) in the middle. In some embodiments, the switch RDL 125 may overlap the electro-optical chips 130, 135 without the switch integrated circuit 122 on the switch RDL 125 overlapping the electro-optical chips 130, 135 (as shown on the left side of FIG. 1a); in such an embodiment conductive paths between the electro-optical chips 130, 135 and the switch integrated circuit 122 (or between the electro-optical chips 130, 135 and PMD circuit, discussed below) may extend through both vias and conductive traces in the switch RDL 125. In other embodiments, the switch integrated circuit 122 (or PMD circuits, discussed below) may overlap the electro-optical chips 130, 135 (e.g., as shown (for the switch integrated circuit 122) on the right side of FIG. 1a and in FIG. 1c); in such an embodiment conductive paths between the electro-optical chips 130, 135 and the switch integrated circuit 122 (or between the electro-optical chips 130, 135 and PMD circuits) may, if a switch RDL 125 is present, extend through vias in the switch RDL 125 (without extending through conductive traces in the switch RDL 125, as discussed below).

Figure 1C:
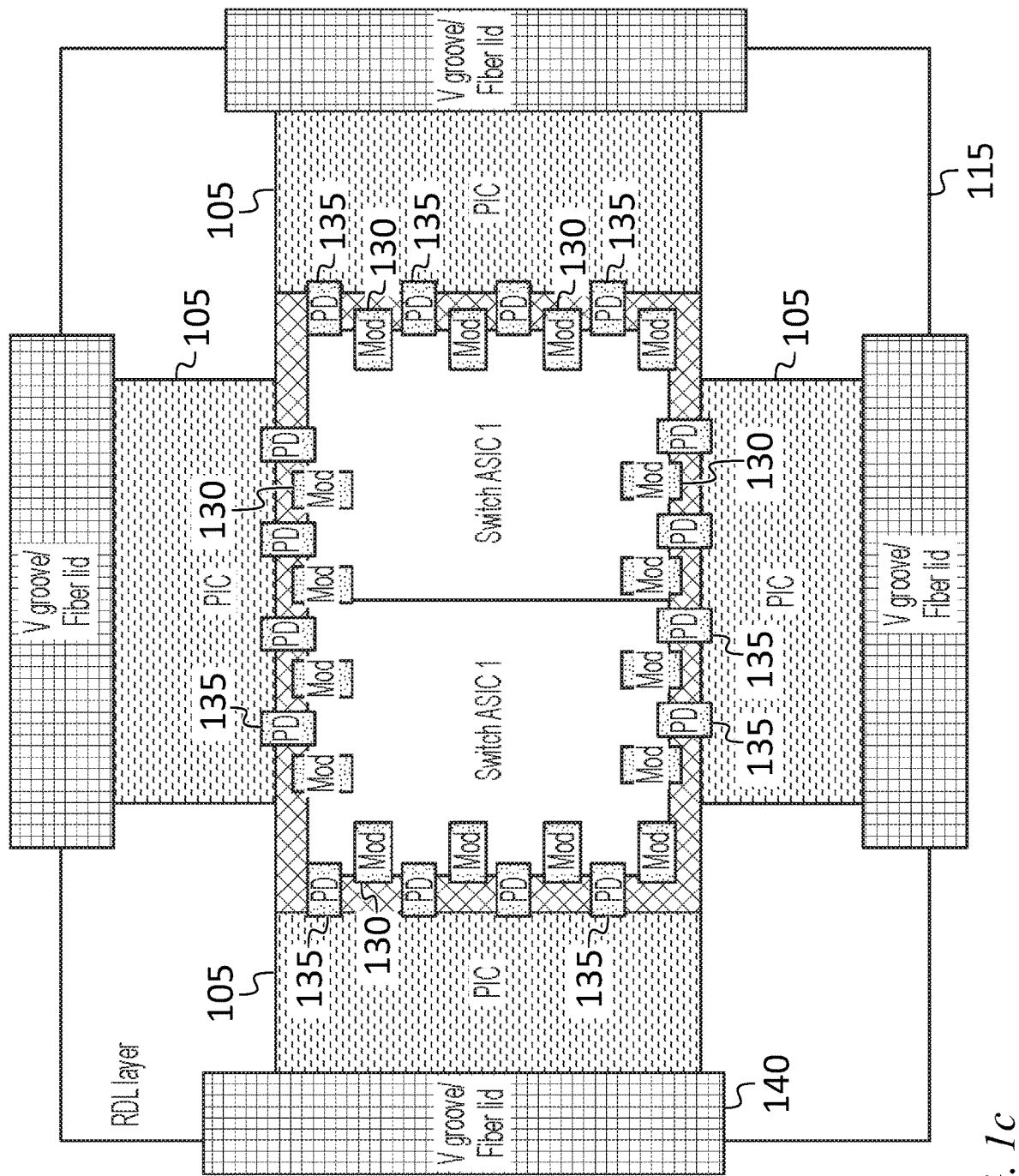
FIG. 1c is an approximate top cross-sectional view along section line 1c-1c of FIG. 1a, according to an embodiment of the present disclosure.

The electro-optical package may further include one or more physical medium dependent PMD circuits, each of which may include one or more transimpedance amplifiers for amplifying the signals from photodetectors, or one or more modulator drive circuits for driving modulators, or both. Each PMD circuit may be on a chip, or part of an array of PMD circuits (e.g., an array of modulator drivers or an array of transimpedance amplifiers) fabricated on a chip, and the PMD chips may be integrated into the switch ASIC module 120 (which may be, e.g., a multi-chip package) with the switch integrated circuit 122. In some embodiments the PMD circuits are instead directly integrated with the switch integrated circuit 122 into an electronic integrated circuit (i.e., into a single chip, or "die"), and separate PMD chips are not used. In embodiments in which the switch RDL 125 extends beyond the edges of the integrated circuits (e.g., the PMD chips and the one or more switch integrated circuits 122) of the switch ASIC module 120 (as in the embodiment of FIG. 1a), the integrated circuits may or may not overlap portions of the PICs 105 or portions of the electro-optical chips 130, 135, or both. In FIG. 1c, the entire outline of each modulator chip 130 and photodiode chip 135 is shown for simplicity, even though in a true cross sectional view portions of the modulator chips 130 and photodiode chips 135 not extending beyond the perimeter of the switch ASIC module 120 would not be visible. The configuration of FIGS. 1b and 1c differs slightly from that of FIG. 1a, for example with respect to the positions of the electro-optical chips 130, 135 with respect to the edges of the switch integrated circuits 122.

FIGS. 1a and 1c show two switch integrated circuits 122; in some embodiments more switch integrated circuits 122 are present, or only one switch integrated circuit 122 is present. A plurality of switch integrated circuits 122 (e.g., an even number of rectangular switch integrated circuits 122) may be used, for example, if the circuitry to be included in the switch ASIC module 120 occupies a chip area exceeding the size of a reticle used in the fabrication of the switch integrated circuits 122. When a plurality of switch integrated circuits 122 is used, the gap between adjacent switch integrated circuits 122 may be small, e.g., less than 100 microns or less than 50 microns. If the PMD circuits are in separate chips from the switch integrated circuit or circuits 122, the PMD circuits may be arranged around the perimeter of the switch integrated circuit 122 or around the perimeter of the plurality of switch integrated circuits 122. FIGS. 1b and 1c are drawn to scale, for one embodiment. It will be understood, however, that in other embodiments the proportions of the features may vary from those shown in FIGS. 1b and 1c. In some embodiments overmold is (as shown in FIG. 1a) absent from the electro-optical package except in the switch ASIC module 120 or, in some embodiments, overmold is absent entirely from the electro-optical package.

The embodiment of FIGS. 1a-1c employs a "chip on multiple chips" packaging solution in which the high speed pins are directly bonded (by copper pillars) to capture pads on the PICs 105 while the central low speed DC, power and ground pins are connected to the via interposer (FIG. 1c). In some embodiments, each photonic integrated circuit 105 (PIC) has four modulators and four photodiodes bonded to the silicon. Electrical connections between the electro-optical chips 130, 135 (the modulator chips 130 and photodiode chips 135) and conductive traces on the photonic integrated circuit 105 may be made by eutectic bonds, and the conductive traces form connections to the capture pads on the photonic integrated circuit 105. The PIC 105 further includes waveguides, mode convertors and V-groove structures that couple the light signal from modulators to single mode fibers (SMFs) (i.e., single mode optical fibers) and from SMFs to photodiodes (FIG. 1b). The mode converters may include tapered waveguides and may be configured to convert optical modes of single-mode fibers to optical modes (e.g., smaller modes) that may propagate in waveguides on the PICs 105 and that may couple (in some embodiments, through additional mode converters) to the electro-optical chips 130, 135. The electro-optical chips 130, 135 (e.g., the modulator chips 130 and photodiode chips 135) are thinned to ensure that their top surfaces are substantially flush with the top surface of the PIC 105. Measures may be taken to ensure that the electro-optical chips 130, 135 do not extend above the top surface of the PIC 105 by enough to create mechanical interference between the switch ASIC module 120 and the electro-optical chips 130, 135.

In some embodiments, conductive paths carrying high-speed signals are vertical in the switch RDL 125 (i.e., the signals travel only through vias, not through traces, in the switch RDL 125). Further, in some embodiments, the peripheral high speed pins of the switch ASIC module 120 may be bonded directly to pads on the electro-optical chips 130, 135, thereby forming low loss, impedance matched high speed connections to the electro-optical chips 130, 135. Such an embodiment may require relatively precise alignment of the electro-optical chips 130, 135, both laterally and vertically (i.e., more precise flushness, of the top surfaces of the electro-optical chips 130, 135 with the top surface of the PIC 105, than if the flushness were required only to avoid mechanical interference).

In some embodiments the electro-optical chips 130, 135 are monolithically integrated into the PICs 105 (or PIC 105, in embodiments, discussed in further detail below, in which there is only one PIC 105), and the peripheral high speed pins on the switch ASIC module 120 are bonded directly to pads, near or on the modulators and photodiodes, on the PIC 105 or PICs 105.

In some embodiments, the modulator chips 130 are staggered with respect to the photodiode chips 135, as shown in FIG. 1a, to minimize crosstalk of high speed signals. The high speed path on the transmitter side starts with high speed signals on the periphery of the switch ASIC module 120 driving the modulator chips 130 on the PIC 105. The electrical to optical conversion happens at the modulator chip 130 (which may receive unmodulated laser light, and apply amplitude modulation to it, in accordance with a electrical signal it receives, to produce modulated light), and the modulated light at the output of each modulator chip 130 is coupled to a waveguide on the PIC 105, and from the waveguide to a SMF. Similarly, the light from single mode fibers couples to the waveguides on the PIC 105, and from the waveguides to the photodiode chips 135. Optical to electrical conversion then happens in the photodiode chips 135 and the electrical high speed signal is transmitted to the switch integrated circuit 122 through the high speed pins on the periphery of the switch ASIC module 120.

Figure 2A:
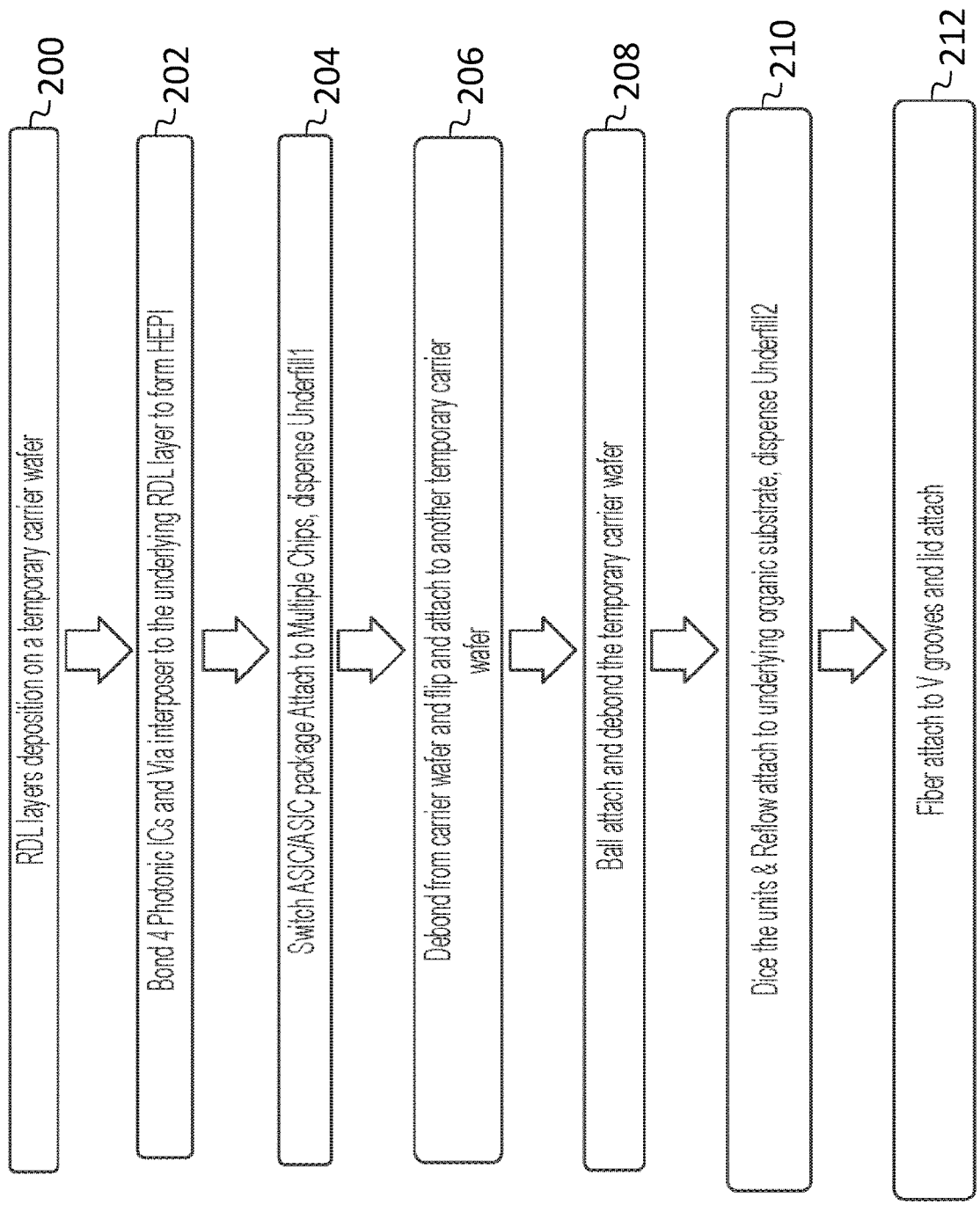
FIG. 2a is a flowchart for a method for fabricating an electro-optical package, according to an embodiment of the present disclosure.
Figure 2B:
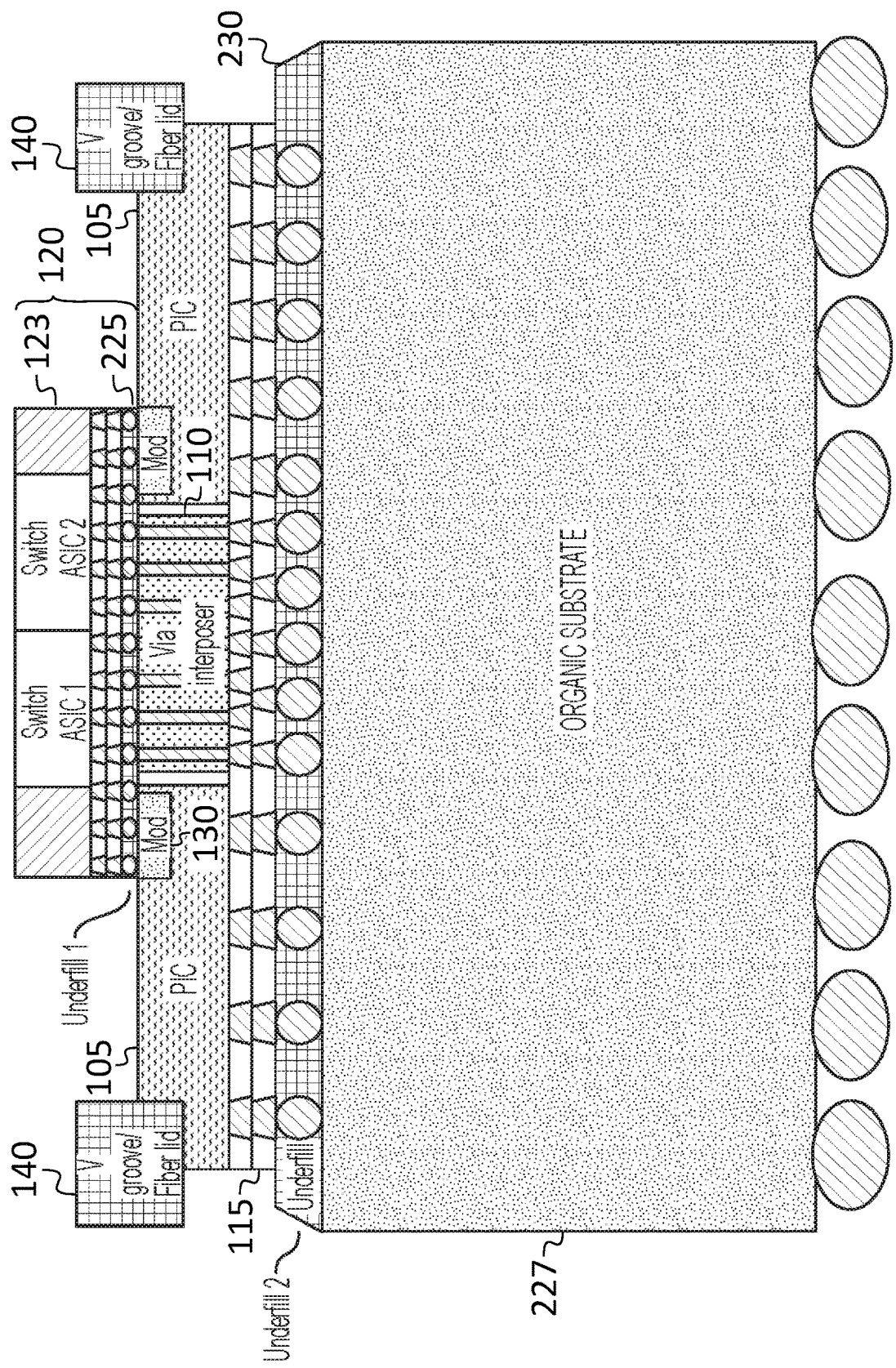
FIG. 2b is a side cross-sectional view of an electro-optical package on an organic substrate, according to an embodiment of the present disclosure.

In some embodiments. the electro-optical package of FIGS. 1a-1c is fabricated by modifying a related art wafer level packaging flow, as illustrated in the flowchart of FIG. 2a and the accompanying diagram, FIG. 2b. The process starts with defining, at 200, redistribution layers (for forming the interposer RDL 115) on a temporary carrier (e.g., a temporary carrier wafer, or a copper panel or a glass panel). This is followed by bonding, at 202, the via interposer 110 in the middle of the interposer RDL 115, and bonding the four PICs 105 to the interposer RDL 115 around the via interposer 110, resulting in a PIC-via interposer wafer level package that (together with an interposer ball grid array 128, discussed in further detail below) can be treated as a hybrid electronic-photonic interposer (HEPI) (FIG. 1b). In some embodiments, the HEPI is a product in its own right (a top view of which may resemble FIG. 1b), that may be supplied (with or without fibers (and fiber lids 140) attached) to other parties for combining with a suitable switch ASIC module 120, to form an electro-optical package (e.g., as in FIG. 1a). The switch ASIC module 120 is then attached, at 204, to the HEPI, so that that the center of the switch ASIC module 120 bonds to the via interposer 110 and the periphery of the switch ASIC module 120 bonds to the four surrounding PICs 105 (FIG. 1c). Underfill may be dispensed under the switch ASIC module 120 to form a first underfill 225 ("Underfill 1") (FIG. 2b).

Some embodiments require precise thickness control of the PICs 105 and via structures. This may be achieved by ensuring that these components are made of CTE matched material (e.g., low CTE silicon) and processed using the same back end technology (thinning and grinding). Stealth dicing technology and chip on wafer platform (pick and place) methods may also provide the placement accuracy needed to support the close packaging of the five dies (FIG. 1b). In some embodiments an overmold is formed over the HEPI, using a process that either keeps the V-grooves free of mold or after which another process may be employed to remove any mold from the V-grooves, so that when the fibers are attached the V-grooves are free of mold. The package is then debonded, at 206, from the temporary carrier and flipped and bonded to another carrier on which ball attach (to form the interposer BGA 128) is performed, at 208, forming the electro-optical package.

The electro-optical package (FIGS. 1a-1c) may be diced and reflow attached, at 210, to a system level organic package 227 (FIG. 2b) followed by dispensing of underfill under the HEPI to form a second underfill 230 ("Underfill 2"). Alternatively, the HEPI package may be attached to the organic substrate first, followed by electronic ASIC attach, if the warpage requirements of the underlying structure are met (FIG. 2b). Fibers are then passively attached, at 212, to the V-grooves in the PICs 105 (and aligned, by the V-grooves to waveguides or waveguide mode converters on the PICs 105) and held in place by epoxy and by the lid 140, which may also be secured in place by epoxy. Testing of intermediate products may be performed at various stages. For example, optical fibers may be coupled to the PICs 105 temporarily for testing (either using active alignment or passive alignment (e.g., using the V-grooves to align the optical fibers to features (e.g., waveguides or mode converters) on the PICs 105), the PICs 105 may have loopback waveguides for quantifying the coupling loss between waveguides on the PICs 105 and the electro-optical chips 130, 135, and the functioning of the electro-optical chips 130, 135 may be tested by making connections to them with suitable probes.

Figure 3A:
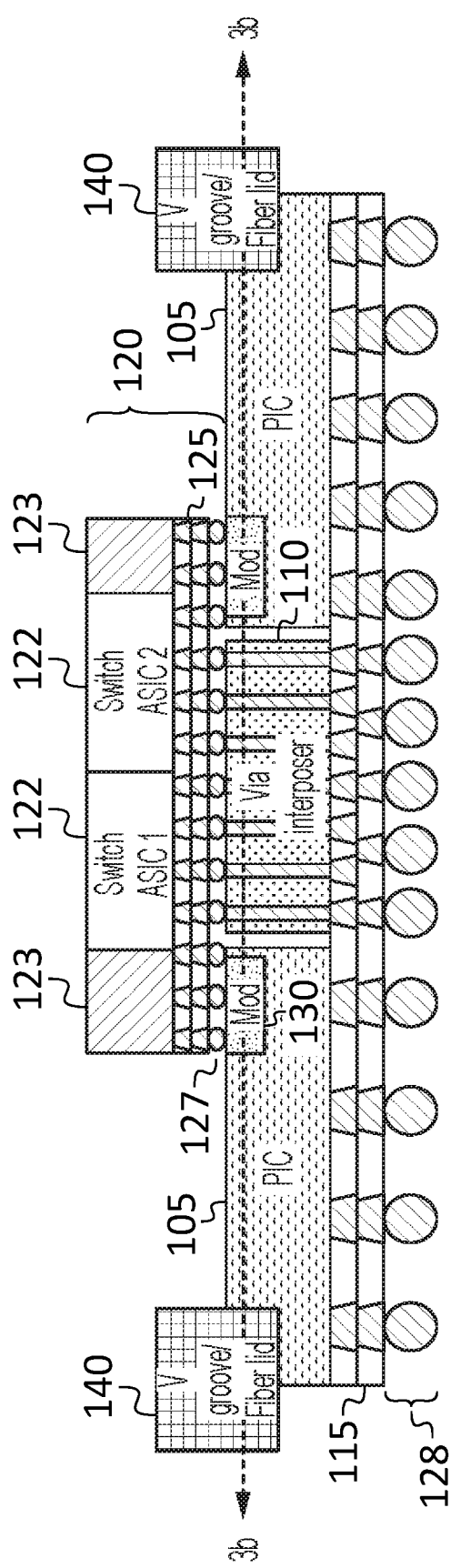
FIG. 3a is a side cross-sectional view of an electro-optical package, according to an embodiment of the present disclosure.
Figure 3B:
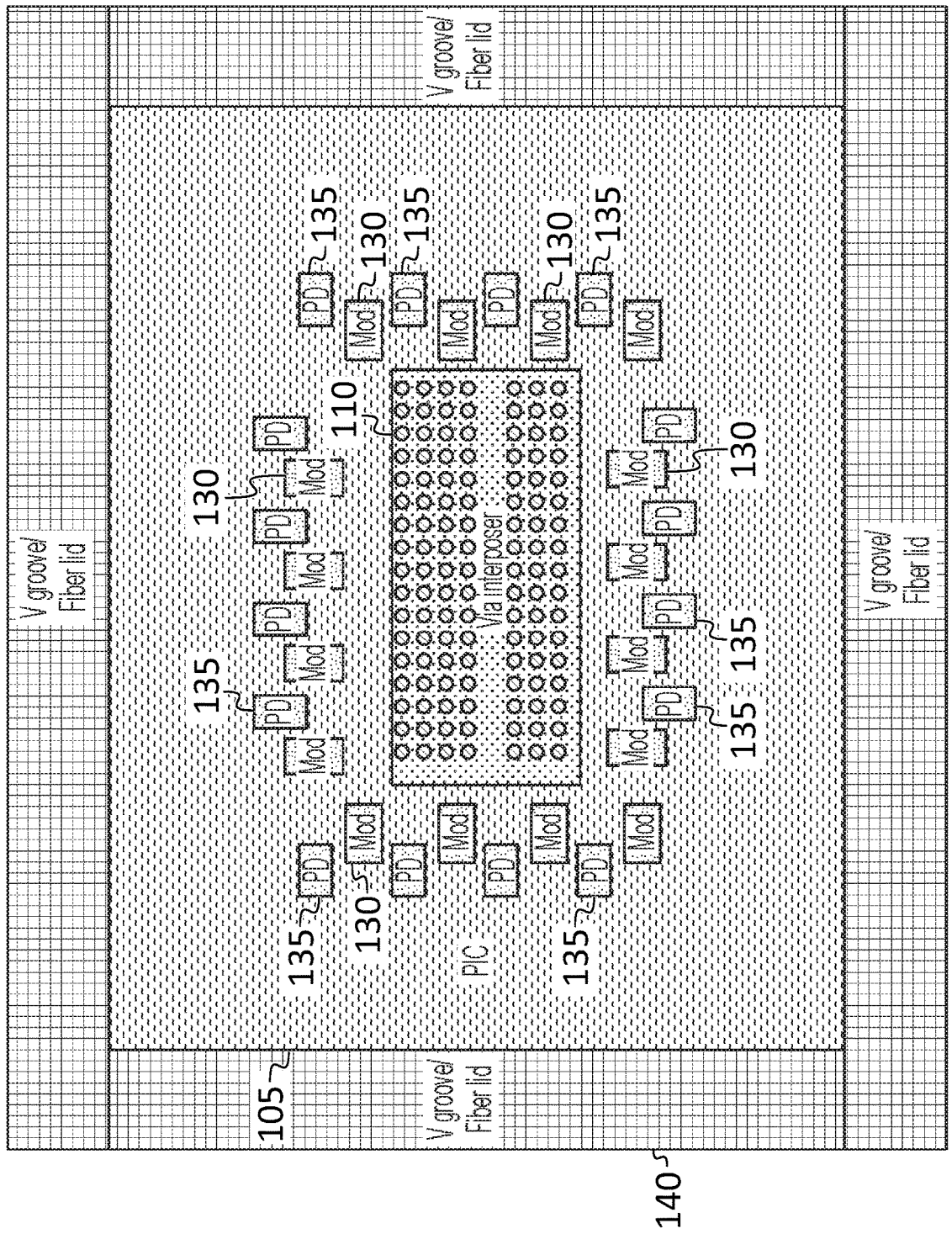
FIG. 3b is an approximate top cross-sectional view along section line 3b-3b of FIG. 3a, according to an embodiment of the present disclosure.

In some embodiments the PIC 105 (or each PIC 105), instead of being a simple rectangle as shown in FIGS. 1b and 1c, may have a cutout to accommodate the via interposer 110. For example, the PIC 105 may be "L"-shaped and wrap around two sides of the via interposer 110, or it may be "C"-shaped (or "U"-shaped) and wrap around three sides of the via interposer 110. In some embodiments a single PIC 105 wraps around all four sides of the via interposer 110 and accommodates 16 modulators and 16 photodiodes around the center, as shown in FIGS. 3a and 3b. Although this embodiment differs from that of FIGS. 1a-1c, the cross section shown in FIG. 3a may be the same as the cross section shown in FIG. 1a. The single PIC 105 may be a "hollow" chip (i.e., it may have a rectangular (or square) cutout to accommodate a separately fabricated via interposer 110, as illustrated in FIGS. 3a and 3b), or the via interposer 110 may be fabricated as part of the same chip (as discussed in further detail below).

Figure 4A:
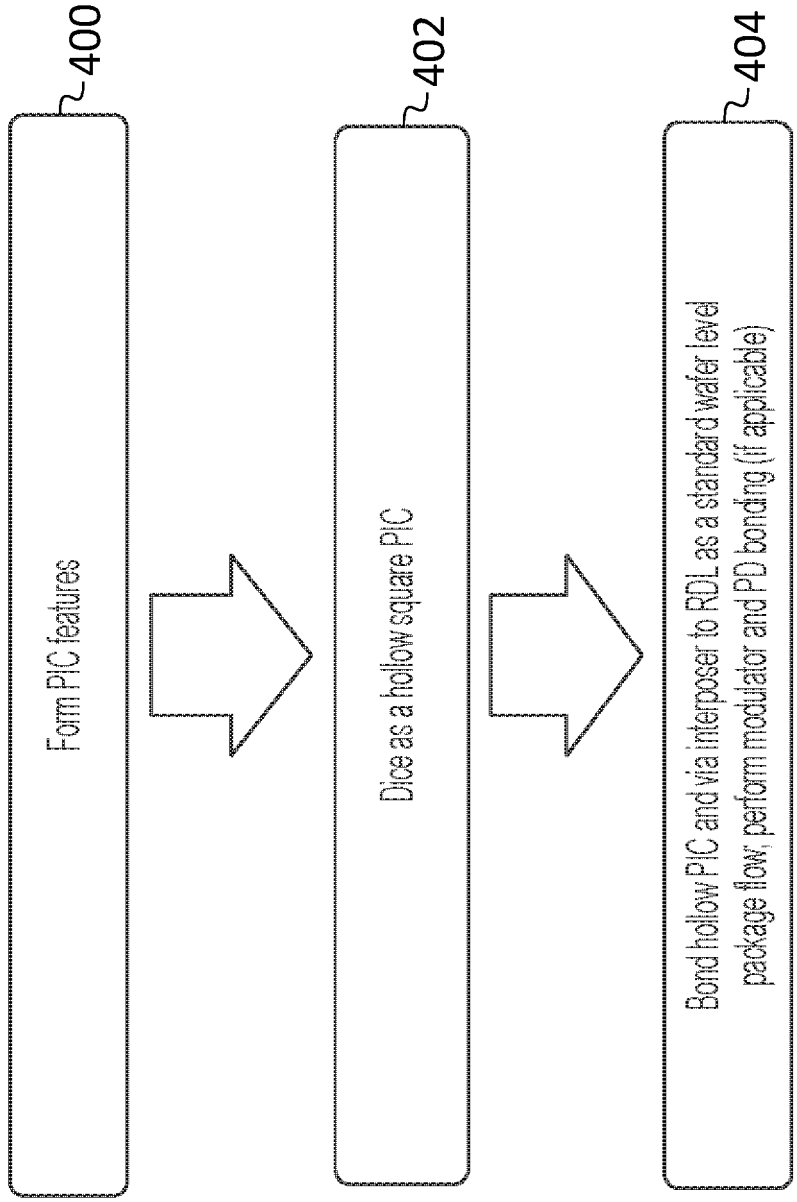
FIG. 4a is a flowchart for a method for fabricating an electro-optical package, according to an embodiment of the present disclosure.
Figure 4B:
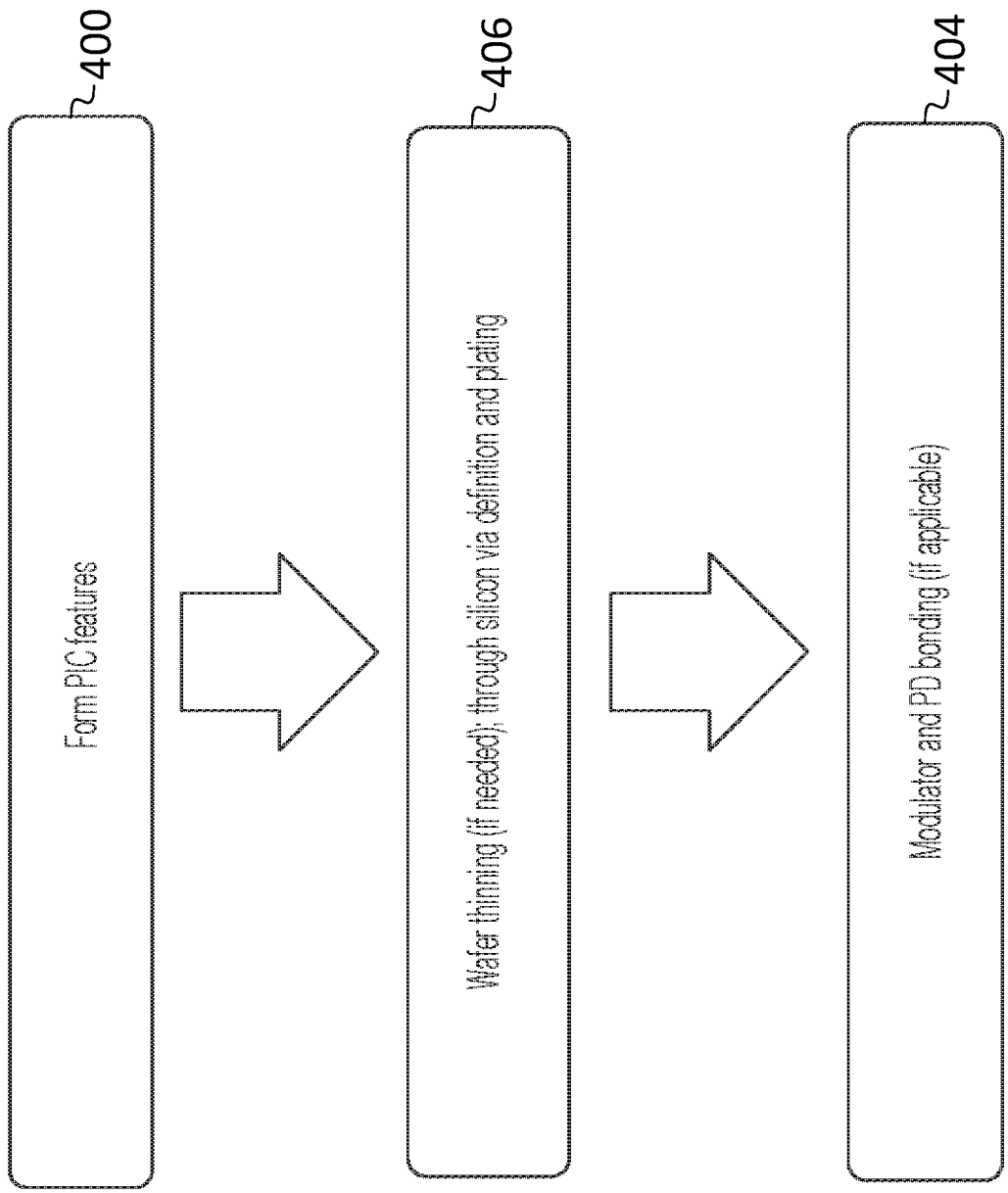
FIG. 4b is a flowchart for a method for fabricating an electro-optical package, according to an embodiment of the present disclosure.

FIG. 4a is a flowchart showing a method for fabricating the embodiment of FIGS. 3a and 3b, and FIG. 4b is a flowchart showing a method for fabricating a similar embodiment in which the via interposer is monolithically integrated with the PIC 105 (i.e., fabricated as part of the same chip as the PIC 105). Referring to FIG. 4a, PIC features (e.g., waveguides, mode converters (e.g., waveguide mode converters), V-grooves, and cavities for the modulators and photodiodes (if applicable)) are formed, at 400, on the PIC 105. If the electro-optical chips 130, 135 are monolithically integrated with the PIC 105, then these may be formed (instead of cavities for the modulators and photodiodes) at this time also. A rectangular or square cutout may be diced out of the PIC 105, and the PIC 105 may be diced, at 402, out of the wafer (e.g., the silicon wafer) from which it is formed, using a dicing method (e.g., laser dicing) suitable for forming the rectangular or square cutout. Next, the hollow PIC 105 may be bonded, at 404, to the interposer RDL along with the via interposer, and the modulators and photodiodes may be bonded into the cavities, if applicable (i.e., if they are not monolithically integrated with the PIC 105).

Referring to FIG. 4*b*, the method for forming a structure in which the via interposer is monolithically integrated with the PIC 105 is similar, but (i) instead of forming a rectangular or square cutout to accommodate the via interposer 110, the PIC 105 is thinned (if needed) and through silicon via definition and plating is used, at 406, to form a plurality of vias (e.g., a grid of vias) to form the monolithically integrated via interposer, and (ii) the via interposer is not separately bonded, at 404. Thinning may be needed if the thickness of the wafer used to fabricate the PIC 105 is too great to allow through silicon via definition and plating. In some embodiments, only a central region of the PIC 105 is thinned and measures are taken for accommodating the resulting step in the top surface or in the bottom surface of the PIC 105.

If the PIC 105 is sufficiently large that a suitable mask or "reticle" is not readily available, then a single reticle suitable for forming the features corresponding to one of the PICs 105 of FIGS. 1*a*-1*c* may be used four times (being, e.g., rotated 90 degrees and suitably translated between one use and the next) to form the PIC features respectively above, to the right of, below, and to the left of, the electronic ASIC, as shown in FIG. 3*b*.

As used herein, the terms "rectangle" and "rectangular" include the special case "square", so that a "square" is an example of a rectangle and a square element is also a rectangular element. As used herein, "a portion of" something means all, or less than all, of the thing. As such, for example "a portion of the photonic integrated circuit" means all or less than all of the photonic integrated circuit.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Although exemplary embodiments of an electro-optical package have been specifically described and illustrated herein, many modifications and variations will be apparent to those skilled in the art. Accordingly, it is to be understood that an electro-optical package constructed according to principles of this disclosure may be embodied other than as specifically described herein. The invention is also defined in the following claims, and equivalents thereof.

What is claimed is:

1. A package, comprising:
an electronic integrated circuit module;
a first electro-optical component; and
a photonic integrated circuit,
the first electro-optical component being in a top surface of the photonic integrated circuit,
the electronic integrated circuit module comprising a redistribution layer and having a top surface facing toward and overlapping:
a portion of the first electro-optical component; and
a portion of the photonic integrated circuit.

2. The package of claim 1, wherein the electronic integrated circuit module comprises:
an electronic integrated circuit chip having a top surface; and
a plurality of conductors protruding from the top surface of the electronic integrated circuit chip,
wherein the top surface of the electronic integrated circuit chip faces toward and overlaps:
a portion of the first electro-optical component, and
a portion of the photonic integrated circuit; and
wherein a conductive path from the electronic integrated circuit chip to the first electro-optical component extends through a conductor of the plurality of conductors.

3. The package of claim 1, wherein the electronic integrated circuit module further comprises:
an electronic integrated circuit chip having a top surface, the redistribution layer being on the top surface of the electronic integrated circuit chip; and
a plurality of conductors protruding from a top surface of the redistribution layer,
wherein the top surface of the redistribution layer faces toward and overlaps:
a portion of the first electro-optical component; and
a portion of the photonic integrated circuit, and
wherein a conductive path from the electronic integrated circuit chip to the first electro-optical component extends through a conductor of the plurality of conductors.

4. The package of claim 3, further comprising an underfill surrounding each of the plurality of conductors.

5. The package of claim 3, wherein the electronic integrated circuit module comprises a physical medium dependent circuit, configured to interface with the first electro-optical component.

6. The package of claim 5, wherein the physical medium dependent circuit is in the electronic integrated circuit chip.

7. The package of claim 5, wherein the physical medium dependent circuit is in a chip, separate from the electronic integrated circuit chip, on a bottom surface of, and connected to, the redistribution layer.

8. The package of claim 1, wherein the first electro-optical component is a chip embedded in a cavity in the top surface of the photonic integrated circuit.

9. The package of claim 8, further comprising a eutectic bond between the first electro-optical component and a conductive trace on the top surface of the photonic integrated circuit.

10. The package of claim 1, wherein the first electro-optical component is integral with the photonic integrated circuit.

11. The package of claim 1, further comprising a second electro-optical component, wherein:
the first electro-optical component comprises a photodiode chip, and
the second electro-optical component comprises a modulator chip.

12. A method for fabricating a package, the method comprising forming a first intermediate product on a first temporary carrier, the forming of the first intermediate product comprising:
forming a redistribution layer on the first temporary carrier;
bonding a via interposer to the redistribution layer;
bonding a photonic integrated circuit to the redistribution layer; and
attaching an electronic integrated circuit module to the via interposer and to the photonic integrated circuit.

13. The method of claim 12, further comprising:
debonding the first intermediate product from the first temporary carrier;
flipping the first intermediate product;
attaching the flipped first intermediate product to a second temporary carrier; and
forming a ball grid array on the redistribution layer.

14. A package, comprising:
an electronic integrated circuit module;
a first electro-optical component;
a photonic integrated circuit; and
a via interposer abutting against a top surface of the electronic integrated circuit module,
the first electro-optical component being in a top surface of the photonic integrated circuit,
the top surface of the electronic integrated circuit module facing toward and overlapping:
a portion of the first electro-optical component; and
a portion of the photonic integrated circuit.

15. The package of claim 14, wherein the via interposer has:
a first surface facing the electronic integrated circuit module;
a second surface opposite the first surface; and
a plurality of conductive vias extending from the first surface to the second surface, and
the conductive vias being respectively electrically connected to a plurality of conductors on the top surface of the electronic integrated circuit module.

16. The package of claim 15, wherein the via interposer is a separate element from the photonic integrated circuit.

17. The package of claim 16, wherein the photonic integrated circuit has a cutout to accommodate the via interposer, and the photonic integrated circuit wraps around at least two sides of the via interposer.

18. The package of claim 17, wherein:
the via interposer is rectangular,
the cutout is a hole, and
the photonic integrated circuit wraps around all four sides of the via interposer.

19. The package of claim 15, further comprising a redistribution layer having a top surface and a bottom surface, the bottom surface abutting against:
the bottom surface of the photonic integrated circuit; and
the second surface of the via interposer.

20. The package of claim 19, further comprising a plurality of conductors protruding from the top surface of the redistribution layer.

21. The package of claim 15, wherein the via interposer is integral with the photonic integrated circuit.

22. A hybrid interposer, comprising:
an electro-optical component;
a photonic integrated circuit; and
a via interposer,
the electro-optical component being in a top surface of the photonic integrated circuit,
the via interposer begin adjacent to an edge of the photonic integrated circuit and having:
a first surface substantially level with a top surface of the photonic integrated circuit;
a second surface opposite the first surface; and
a plurality of conductive vias extending from the first surface to the second surface.

23. The hybrid interposer of claim 22, further comprising a redistribution layer,
the photonic integrated circuit being on a bottom surface of the redistribution layer; and
the via interposer being on the bottom surface of the redistribution layer, a via of the via interposer being connected to a conductor in the redistribution layer.

24. The hybrid interposer of claim 23, wherein the top surface of the photonic integrated circuit has:
a waveguide mode converter, and
a V-groove,
the V-groove being configured to align an optical fiber to the waveguide mode converter,
the waveguide mode converter being configured to couple light between the optical fiber and the electro-optical component.

25. The hybrid interposer of claim 24, further comprising a plurality of conductors protruding from a top surface of the redistribution layer.

* * * * *